United States Patent [19]

Hiraoka et al.

[11] Patent Number: 4,690,838

[45] Date of Patent: Sep. 1, 1987

[54] PROCESS FOR ENHANCING THE RESISTANCE OF A RESIST IMAGE TO REACTIVE ION ETCHING AND TO THERMAL FLOW

[75] Inventors: Hiroyuki Hiraoka, Saratoga; Jeffrey W. Labadie, Campbell; James H. Lee, San Jose; Scott A. MacDonald, San Jose; Carlton G. Willson, San Jose, all of Calif.

[73] Assignee: International Business Machines Corporation, Armonk, N.Y.

[21] Appl. No.: 899,589

[22] Filed: Aug. 25, 1986

[51] Int. Cl.$^4$ .............................. G03C 5/00; B05D 3/04
[52] U.S. Cl. .................................. 427/343; 427/383.1; 427/419.8; 427/248.1; 156/628; 430/324; 430/325; 430/326; 430/331
[58] Field of Search ............... 430/325, 326, 330, 331; 427/343, 383.1, 419.8, 248.1, 341, 126.1; 156/628

[56] References Cited

U.S. PATENT DOCUMENTS

| | | | |
|---|---|---|---|
| 4,201,800 | 5/1980 | Alcorn et al. | 430/5 |
| 4,239,781 | 10/1980 | Piascinski et al. | 430/5 |
| 4,259,369 | 3/1981 | Canavello et al. | 427/155 |
| 4,259,421 | 3/1981 | Goldman | 430/5 |
| 4,307,178 | 12/1981 | Kaplan et al. | 430/296 |
| 4,439,516 | 3/1984 | Cernigliaro et al. | 430/323 |

OTHER PUBLICATIONS

Radiation Chem. Photochem., vol. 96, 1982, Abstract 152832t.
Radiation Chem. Photochem., vol. 97, 1982, Abstract 153930f.

*Primary Examiner*—John E. Kittle
*Assistant Examiner*—José G. Dees
*Attorney, Agent, or Firm*—Joseph G. Walsh

[57] ABSTRACT

The reactive ion etching and thermal flow resistance of a resist image is enhanced by contacting the resist image with an alkyl metal compound of magnesium or aluminum.

9 Claims, No Drawings

PROCESS FOR ENHANCING THE RESISTANCE OF A RESIST IMAGE TO REACTIVE ION ETCHING AND TO THERMAL FLOW

TECHNICAL FIELD

The present invention is concerned with a process for enhancing the resistance of a resist to reactive ion etching and to thermal flow.

BACKGROUND ART

In the manufacture of microcircuits, it is often desired to have resist images which are resistant to thermal flow and which are also resistant to reactive ion etching. In the past, a large amount of research has been done to achieve either or both of these objectives. Some such work is show, for example, in U.S. Pat. Nos. 4,201,800, 4,230,781, 4,259,421 and 4,439,516. See also CHEMICAL ABSTRACTS, Vol. 96:152832t and CHEMICAL ABSTRACTS, Vol. 97:153930f, both 1982.

The prior art methods have obtained some success but they still leave much to be desired, particularly in the area of simultaneously enhancing both the resistance to reactive ion etching and to thermal flow. The prior art also has not been very successful in the treatment of thick resists, particularly bilayer resists. Inspection of the cited prior art makes it obvious that none uses the alkyl metal compounds of the present invention.

DISCLOSURE OF THE INVENTION

According to the present invention, the resistance of a resist image to reactive ion etching and to thermal flow is enhanced by contacting the resist image with an alkyl metal compound of magnesium or aluminum.

The process of the present invention is broadly applicable to resist images, particularly including photoresist images. It is applicable to many types of resists, including, for example phenolic resins, novolac resins, poly(-para-hydroxy styrene), poly(methyl methacrylate) and other acrylate esters, and also copolymers.

The alkyl metal compounds used in the present invention include dialkyl-magnesium compounds and trialkyl-aluminum compounds, and also other compounds wherein at least one alkyl group is linked to the metal. Examples of these include triethyl aluminum, diisobutyl aluminum hydride, diethoxyethyl aluminum, lithium diisobutyl aluminum hydride, diethyl magnesium and Grignard reagents. Such materials are well known in the art and are commercially available. In the operation of the process of the present invention, the resist should comprise a polymer which has a group which reacts with the alkyl metal compound to undergo metallation or salt formation.

The actual contacting of the resist image with the alkyl metal compound may be carried out simply by dissolving the metal alkyl compound in a solvent and dipping the resist image in the solution. Alternatively, the contacting may also be carried out in the vapor state, wherein the alkyl metal compound has been vaporized.

By the process of the present invention, thermal flow resistance, at least up to 250 degrees C., is obtained without any reticulation in large surface areas, such as is often found in prior art methods of treatment.

As a result of the present invention, a resist image is given increased resistance to reactive ion etching when the etching is carried out using any halogen-containing gases, such as $CF_4$, $SF_6$ and $CCl_2F_2$, and also oxygen as well. The resist images can be removed in N-methyl-2-pyrrolidinone after these reactive ion etching treatments.

It should be emphasized that the process of the present invention incorporates magnesium or aluminum deeply inside the resist image, i.e., about 1 $\mu$m, as measured from ESCA depth profile and Argon sputtering rates. This deep incorporation of metals permits the use of bilayer resists and is one of the unexpected advantages of the present invention.

As possible alternatives to alkyl magnesium and alkyl aluminum reagents, other organometallic reagents will occur to those skilled in the art, provided the metal forms a refractory oxide or fluoride, and reaction occurs with OH and/or ester groups. Esters react readily with alkyl metal compounds of the group IA and IIA metals, while OH groups undergo reaction with the above as well as other alkyl metal reagents, including those of boron, copper, zinc, cadmium, and other transition metals. In addition, the above metals form refractory fluorides and oxides.

The following examples are given solely for purposes of illustration and should not be considered as limitations on the present invention, many variations of which will occur to those skilled in the art without departing from the spirit or scope thereof.

Dialkyl-Magnesium: Dibutyl-magnesium solution (0.7M in heptane) and diethyl-magnesium solution (0.7M in ether) were used.

Dibutyl-Magnesium Treatment: Images from two types of commercial diazonaphthoquinone novolac matrix resists, with thicknesses of 3.2 $\mu$m and 3.7 $\mu$m respectively, on silicon wafers were dipped into the magnesium solution either for 15 sec or 50 sec, then, immediately into toluene for rinsing. Afterwards, toluene was flushed away with nitrogen stream. The whole process was carried out in a nitrogen atmosphere. The incorporation of magnesium into the resist films was confirmed with ESCA measurements.

Halogen-Based RIE Measurements: As halogen-containing gases, pure $SF_6$ and an 1:1 argon/dichlorodifluoromethane mixture were used. The 15-sec treatment provided 13 times enhancement in $SF_6$ RIE resistance for the diazonaphthoquinone-novolac resist. The similar result was obtained with dichlorodifluoromethane RIE; here, the thickness loss of the magnesium-treated resist films was so small that the enhancement ratio was difficult to assess.

Thermal Flow Resistance: Resist images were treated exactly in the same way as described above. For comparison purpose, uv-hardened images were heated side-by-side with non-treated sample on a hot plate; the surface temperature of the hot plate was 175 degrees C. The untreated sample deformed badly at 175 degrees C. The uv-bonded sample, and also the sample treated by the present invention, showed no deformation at 250 degrees C.

Trialkyl Aluminum Treatments

Solution: The solution treatment of resist images was carried out by dipping a wafer with resist images into a hexane solution of triethyl aluminum (1.0M solution) for 1 to 4 min at room temperature, followed immediately by rinsing with toluene/heptane, and by nitrogen blowing. The treatment was done in a nitrogen atmosphere. After the nitrogen blowing, the wafer was processed in air.

Vapor Phase: For the vapor-phase treatment a wafer with resist images was placed in a vessel with a rubber septum for an injection of trimethyl aluminum. Then, the vessel was evacuated by a mechanical pump to 50 micron pressure, followed by an injection of trimethyl aluminum solution (1 ml of 1M hexane solution per 500 ml volume). The wafer was kept inside the vessel for one hour at room temperature. Unreacted trimethyl aluminum and hexane were blown off in a nitrogen stream.

Argon Sputtering

Argon Ion Sputtering Rates and Depth Profiles: Depth profiles of these metal atoms in resist films were measured with ESCA and argon ion sputtering, while at the same time the sputtering rate was measured with an Alpha Step 200 thickness measurement instrument. Argon sputtering was carried out in a Plasma Therm diode system under following conditions: incident power of 150 W/11" diameter, −220 V bias potential, 20 sccm, 72 mTorr, 25 C aluminum substrate surrounded by a poly(methyl methacrylate) ring.

We claim:

1. A process for increasing the reactive ion etching and thermal flow resistance of a resist image, said process being characterized by contacting said resist image with a alkyl metal compound of magnesium or aluminum, the resist comprising a polymer which has a group which reacts with the alkyl metal compound to undergo metallization or salt formation.

2. A process as claimed in claim 1 wherein the resist is a photoresist.

3. A process as claimed in claim 1 wherein the resist is a phenolic resin.

4. A process as claimed in claim 1 wherein the resist is a novolac resist.

5. A process as claimed in claim 1 wherein the resist is in a bilayer resist.

6. A process as claimed in claim 1 wherein the alkyl metal compound is a dialkyl-magnesium compound.

7. A process as claimed in claim 1 wherein the alkyl metal compound is a trialkyl-aluminum compound.

8. A process as claimed in claim 1 wherein the contacting is carried out with the alkyl metal compound in a solution.

9. A process as claimed in claim 1 wherein the contacting is carried out with the alkyl metal compound in the vapor state.

* * * * *